United States Patent [19]
Marrs

[11] Patent Number: 5,455,462
[45] Date of Patent: Oct. 3, 1995

[54] PLASTIC MOLDED PACKAGE WITH HEAT SINK FOR INTEGRATED CIRCUIT DEVICES

[75] Inventor: Robert C. Marrs, Scottsdale, Ariz.

[73] Assignee: Amkor Electronics, Inc., Chandler, Ariz.

[21] Appl. No.: 152,935

[22] Filed: Nov. 15, 1993

Related U.S. Application Data

[63] Continuation of Ser. No. 822,297, Jan. 17, 1992, abandoned.

[51] Int. Cl.⁶ .............................. H01L 39/02; H05K 2/00
[52] U.S. Cl. ..................... 257/796; 257/712; 257/718; 361/688; 361/704; 361/707
[58] Field of Search ........................... 257/666, 676, 257/696, 706, 675, 796, 787, 712, 718, 788, 791; 361/688, 697, 702, 704, 707

[56] References Cited

U.S. PATENT DOCUMENTS

| | | |
|---|---|---|
| 3,564,352 | 2/1971 | Lehner . |
| 3,838,984 | 10/1974 | Crane et al. . |
| 4,074,342 | 2/1978 | Honn et al. . |
| 4,105,861 | 8/1978 | Hascoe . |
| 4,168,507 | 9/1979 | Yester, Jr. . |
| 4,410,927 | 10/1983 | Butt . |
| 4,461,924 | 7/1984 | Butt . |
| 4,480,262 | 10/1984 | Butt . |
| 4,594,770 | 6/1986 | Butt . |
| 4,680,613 | 7/1987 | Daniels et al. . |
| 4,701,999 | 10/1987 | Palmer ........................ 437/211 |
| 4,737,395 | 4/1988 | Mabuchi et al. . |
| 4,769,344 | 9/1988 | Sakai et al. ............... 437/216 |
| 4,773,955 | 9/1988 | Mabuchi et al. . |
| 4,835,120 | 5/1989 | Mallik et al. . |
| 4,872,047 | 10/1989 | Fister et al. . |
| 4,888,449 | 12/1989 | Crane et al. . |
| 4,890,152 | 12/1989 | Hirata et al. . |
| 4,891,687 | 1/1990 | Mallik et al. . |
| 4,943,844 | 7/1990 | Oscilowski et al. . |
| 4,949,220 | 8/1990 | Tashiro . |
| 4,974,057 | 11/1990 | Tazima . |
| 4,975,761 | 12/1990 | Chu . |
| 4,994,897 | 2/1991 | Golubic et al. ........................ 257/796 |
| 4,994,936 | 2/1991 | Hernandez . |
| 5,041,902 | 8/1991 | McShane . |
| 5,102,828 | 4/1992 | Marchisi .......................... 437/211 |
| 5,172,214 | 12/1992 | Casto ................................ 257/676 |
| 5,202,288 | 4/1993 | Doering et al. ................... 437/209 |

FOREIGN PATENT DOCUMENTS

| | | | |
|---|---|---|---|
| 57-45959 | 3/1982 | Japan | 257/796 |
| 61-39555 | 2/1986 | Japan | 257/796 |
| 63-205935 | 8/1988 | Japan | 257/796 |
| 63-233555 | 9/1988 | Japan | 257/796 |
| 64-47085 | 2/1989 | Japan | 257/706 |
| 1146346 | 6/1989 | Japan | 257/696 |
| 43450 | 1/1992 | Japan | 257/787 |

Primary Examiner—Sara W. Crane
Assistant Examiner—Carl Whitehead, Jr.
Attorney, Agent, or Firm—Skjerven, Morrill, MacPherson, Franklin & Friel

[57] ABSTRACT

An integrated circuit package including a heat sink is disclosed. The package incorporates an sealing (or locking) ring located circumferentially around the heat sink to provide a better seal between the encapsulant and heat sink and to reduce the possibility that contaminants from outside the package will reach the interior semiconductor die. A stress relief section is formed in the package leads and a dielectric adhesive material is used to attach the package leads to a heat sink surface. The dielectric adhesive creates a secure bond between leads and heat sink, allows heat transfer from the leads to the heat sink, and prevents shorting of the leads to the heat sink.

22 Claims, 10 Drawing Sheets

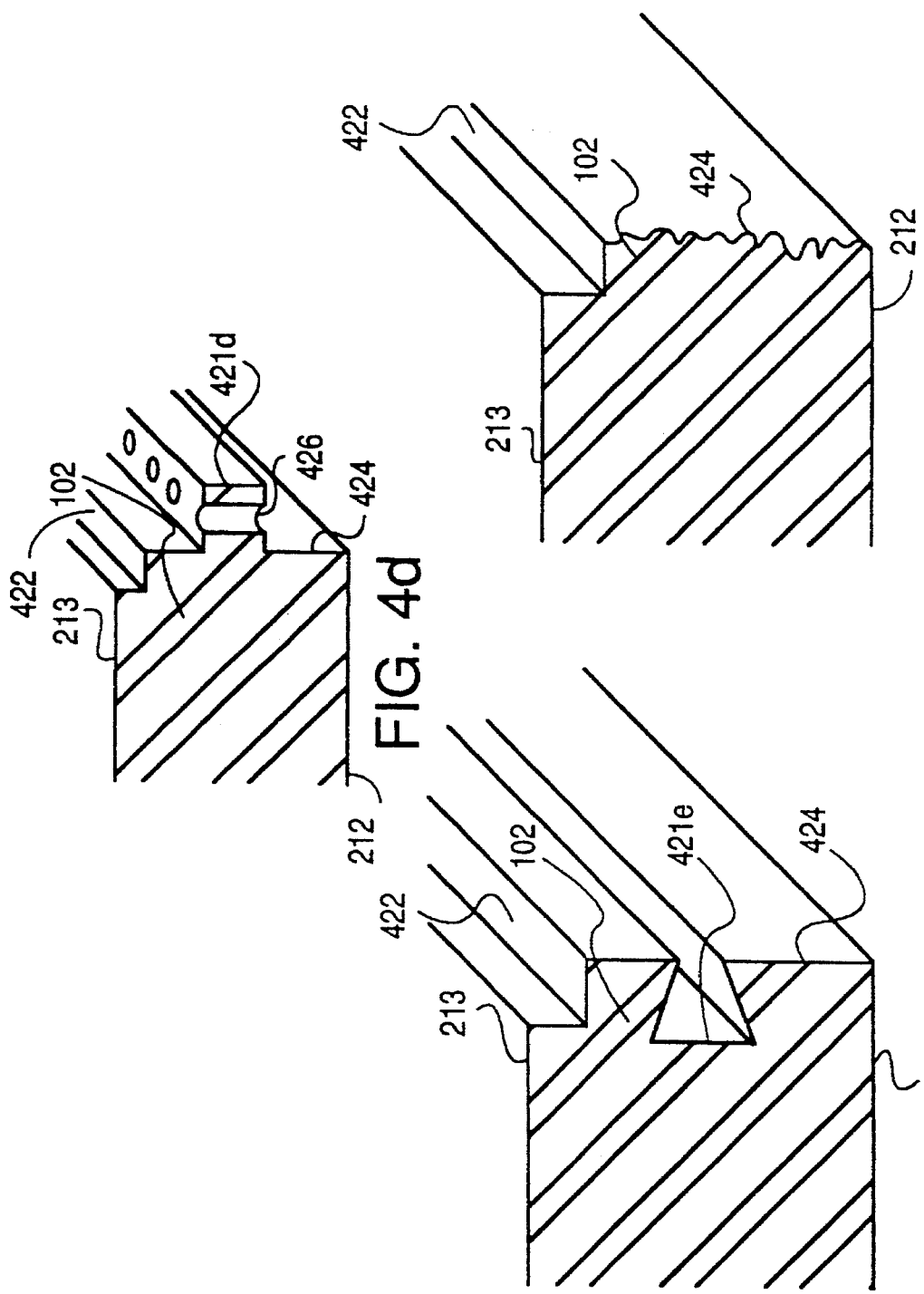

PLASTIC MOLDED PACKAGE WITH HEAT SINK FOR INTEGRATED CIRCUIT DEVICES

This application is a continuation of application Ser. No. 07/822,297, filed Jan. 17, 1992 now abandoned.

BACKGROUND OF THE INVENTION

1. Field of the Invention

This invention relates to electronic de(ice packaging and, in particular, to packaging for integrated circuit devices, hybrid circuits, or modules containing more than one integrated circuit chip. More particularly, the invention relates to plastic encapsulated integrated circuits in packages having leads extending from two or more package sides and incorporating an integral heat sink with an exposed outer surface.

2. Prior Art

During the early developmental stages of semiconductor packaging, the integrated circuit was typically packaged either in a metal can or between a ceramic lid and base. Both packaging materials provided excellent thermal properties, but each also necessitated expensive and time consuming packaging techniques. For example, in ceramic packages the use of two ceramic substrates reflected a sizeable percentage of the total cost of manufacturing the component.

As semiconductor production volumes grew, more cost effective packages were developed. The most notable was the plastic molded package. Although the plastic package provided significant cost savings, the advantageous thermal properties present with metal or ceramic were lacking. As integrated circuit speed and density increased, the need for improved thermal performance (i.e., improved dissipation of heat) became more important. This need motivated the inclusion of a metallic heat sink within the package to remove heat without compromising the reliability of the package because of its mechanical design and the associated assembly process.

Several attempts to improve heat dissipation have been made, the most common being incorporation of a heat sink or spreader into the package. Chu, U.S. Pat. No. 4,975,761, describes several types of heat sinks which are included inside the package. However, these methods do not provide the level of heat dissipation required by newer generations of integrated circuit assemblies.

Additionally, studies have been made of methods of bringing the surface of the heat sink to the outer edge of the package, thereby greatly reducing the thermal resistance. These attempts have been unsuccessful due to various manufacturing difficulties.

In one method, plastic molded packaging of an integrated circuit with heat sink is done by placing the assembly to be packaged in a mold cavity such that the side of the heat sink to which the semiconductor die has been attached faces into the mold cavity. The assembly is restrained by pins or a clamping mechanism attached to the leadframe assembly outside the mold cavity. The opposite side of the heat sink (the outer surface) remains exposed in the completed package. A surface of the mold cavity is brought into contact with the outer surface of the heat sink. Encapsulant is injected into the mold cavity until the cavity is full. When the encapsulant cools and solidifies, the mold cavity is opened and the completed package removed. Several problems have been encountered with this technique.

Current semiconductor package mold tooling design and manufacturing techniques have produced an insufficiently tight seal between the outer surface of the heat sink and the mold cavity. As a result, the high pressures present within the mold cavity during the encapsulation process, as well as dimensional variations from piece to piece between particular heat sinks, can result in separation between the surfaces of the heat sink and the mold cavity. This inadequate sealing allows either encapsulant bleed or flash formation on the exposed heat sink surface. Bleed is the undesirable presence of translucent encapsulant and flash is the undesirable presence of encapsulant greater in thickness than bleed and visible to the naked eye. To remedy this problem, methods were investigated which relied either on specialized mold tooling and techniques to improve the seal between the heat sink and the mold cavity during the encapsulation process, or on expensive hand flash removal after the encapsulation process is complete. Both of these remedies result in inconsistent quality and low yields.

In one method, a vacuum is pulled across the face of the heat sink, holding the heat sink against the mold cavity surface. However, if the seal is insufficiently tight, or if the outer surface of the heat sink is insufficiently flat, plastic encapsulant is sucked into the vacuum mechanism. If this happens, a difficult and expensive clean-up of the vacuum system is required, and bleed or flash results on the surface of the heat sink.

In another method, pneumatically actuated clamping pins contact the face of the heat sink facing into the mold cavity and force the face of the heat sink facing out of the mold cavity against the abutting surface of the mold cavity. However, this method requires sophisticated pin extraction techniques. These techniques are necessary to avoid interference between the pins and bonding wires or internal package leads as the pins are removed, and to avoid marring the surface of the heat sink or having the pins become stuck during retraction.

Another method involves clamping on leadframe members (the leadframe being attached to at least one side of a heat sink "paddle," another side of the paddle protruding and restrained outside of the mold cavity) external to the mold cavity and applying force to these members to push the heat sink against the mold cavity. This method is inapplicable, however, to packages with leads on four sides of the package.

All of the above techniques continue to produce various levels of encapsulant bleed and flash across the exposed surface of the heat sink. This unwanted plastic necessitates extensive and expensive cleaning of the exposed surface prior to subsequent processing operations. It also causes inferior heat dissipation.

A second problem has been encountered with plastic molded integrated circuit packages formed with a heat sink. Heat sinks in transistor package designs are known to allow various quantities of contaminants to migrate from sources outside the package to the surface of the semiconductor die and, specifically, to the bonding pads. Contaminants pass along the interface between the heat sink and the molded plastic due to the lack of an adequate seal. Penetration of the package interior results from the inability to lock the molded plastic securely to the heat sink. Though contaminants may also pass along the interface between leadframe and molded plastic, and some prior art has addressed that problem (e.g., Lehner, U.S. Pat. No. 3,564,352), the major source of contamination of the die in plastic packages with heat sinks is the open path presented by the interface between the heat sink and the molded plastic.

Some solutions to this problem, such as the use of a moisture moat, have proven to be marginally adequate remedies for older generations of less sensitive integrated circuits. However, for newer integrated circuits, these solutions are inadequate.

Other approaches have incorporated locking tabs on the sides of the heat sink. Though adequate for preventing other problems relating to transistor style packages (such as TO-220), these locking tabs are inadequate to seal out levels of moisture to which current generations of integrated circuits are sensitive.

A third problem that has been encountered in plastic molded integrated circuit packages formed with a heat sink concerns the connections between the semiconductor die, leadframe and heat sink. Typically, these connections have been made by affixing the heat sink and semiconductor die to opposing surfaces of a leadframe die mounting paddle as shown in FIG. 6a. To enable heat transfer away from the semiconductor die, a thermally conductive adhesive is applied to paddle surfaces contacting the heat sink and die. Heat is then transferred from the semiconductor die through the first layer of adhesive to the die mounting paddle. From the die mounting paddle is transferred from the packaged integrated circuit through the second layer of adhesive, through the heat sink and then through the remaining bulk plastic material. Severe limitations have been encountered in using this technique for more thermally sensitive semiconductor designs due to the inability of the package to dissipate increased amounts of heat. Although attempts have been made to enhance the thermal flow from the die to the heat sink through the use of materials with improved thermal conductivities, the necessity for the heat to pass through the die mounting paddle and additional adhesive layer before reaching the heat sink continues to constitute a thermal bottleneck.

The connection between the leads and the heat sink presents an additional problem. The adhesive between the heat sink and leads must be electrically insulative in order to prevent shorting between the two. If this adhesive does not completely fill the space between the heat sink and leads, then undesirable electrical conduction, between the heat sink and leads may occur.

SUMMARY OF THE INVENTION

In accordance with the invention there is provided an integrated circuit or circuits, or hybrid circuit or circuits, in a low cost plastic encapsulated package having greatly improved heat dissipation through the reduction of thermal resistance. The reduction of thermal resistance is accomplished primarily by providing a heat sink to which an integrated circuit can be directly attached. The direct attachment eliminates intermediate thermal barriers between the heat sink and integrated circuit. The heat sink has a large surface area (relative to the exterior surface area of the package) exposed outside the package to allow heat to be transferred out of the package. The interior section of the package leads are attached to the heat sink, thus allowing the leads to conduct heat out of the package.

Further in accordance with the invention, a method is provided for manufacturing the electronic devices described above so that mold flashing on the heat sink does not occur. Still further in accordance with the invention, there is provided an integrated circuit, as described above, with superior reliability. This improved reliability results from improved moisture resistance due to the incorporation of techniques for increasing the length of the seal between the plastic encapsulant and the heat sink, and improved fatigue resistance due to the incorporation of techniques for stress reduction in the package leads and in the lead to heat sink attach area.

In accordance with the invention, an improved integrated circuit package and an improved method for making the package are provided. An improved heat sink for use with such a package is also provided.

In one embodiment of the invention an improved sealing (or locking) ring is found circumferentially around a heat sink included in an encapsulated integrated circuit package. The improved sealing ring interlocks with the encapsulant material surrounding the heat sink to create an improved seal between the encapsulant and heat sink. The sealing ring of the invention also creates a longer interface between the heat sink and surrounding encapsulant so that contaminants must travel a longer distance from outside the package to reach the interior semiconductor die. The improved seal between the encapsulant and heat sink also helps reduce the migration of contaminants to the interior of the package.

In another embodiment of the invention, the package leads are shaped so as to provide stress relief. The stress relief alleviates stress created in the leads both during the molding process when the leads are tensioned to provide force to hold the heat sink against the mold cavity, and during package operation due to thermal cycling.

In another embodiment of the invention, a thermally conductive adhesive attaches the semiconductor die directly to the heat sink and a dielectric adhesive material attaches the leads to the heat sink surface. The more direct connection between the die and heat sink allows increased heat transfer from the die to the heat sink. The dielectric adhesive connection between the leads and heat sink creates an improved bond between leads and heat sink, and allows heat to be transferred from the heat sink to the leads. In still another embodiment, the dielectric adhesive prevents shorting of the leads to the heat sink that may otherwise result from the leads being tensioned and slightly deflected during the mold cavity closure.

A method of making a package in accordance with this invention produces a tighter seal between the exposed heat sink surface and the mold cavity during molding. The tighter seal results in reduced bleed and/or flash on the exposed heat sink surface. In one embodiment, the combined thickness of the heat sink and dielectric adhesive is greater than the corresponding dimension of the mold cavity when the mold is closed. Upon mold closure, a surface of the mold cavity presses against the exposed surface of the heat sink, pushing it inward slightly. The package leads are designed to counteract the pushing force and provide the necessary spring tension to create an adequate seal between the heat sink and mold cavity so as to prevent a thin film of encapsulant from forming on the exposed heat sink surface.

In the method according to the invention, the leadframe is retained near the outer ends of the leads by pins or blocks located in the outer periphery of the mold cavity. When the mold closes, it clamps down on both sides of the leadframe in the dam-bar region. During mold closure, the heat sink is forced in a direction parallel to the direction of mold closure. Because of the dimensional mismatch between the heat sink and mold cavity, upon complete mold closure, the leads are slightly bent and stretched, thus inducing tensile forces in the leads. The stress relief provided in the leads provides a spring force which acts to hold the heat sink against the face of the mold cavity.

BRIEF DESCRIPTION OF THE DRAWINGS

FIG. 4d is an orthogonal cross-sectional view of a portion of a heat sink with sealing ring according to still another embodiment of the invention.

FIG. 4e is an orthogonal cross-sectional view of a portion of a heat sink with sealing ring according to another embodiment of the invention.

FIG. 5 is an orthogonal view of a heat sink with a treated surface according to an embodiment of the invention.

DETAILED DESCRIPTION OF THE PREFERRED EMBODIMENTS

In the description that follows, aspects of the invention are described as they apply to a package containing a single integrated circuit. It is to be understood, however, that the invention is equally applicable to packages containing a plurality of integrated circuits. Further, a package according to the invention may also be constructed with or without underlying or interactive interconnect circuitry composed of polymer laminate, ceramic, silicon or metal, or a mixture of these materials.

Figure 1:
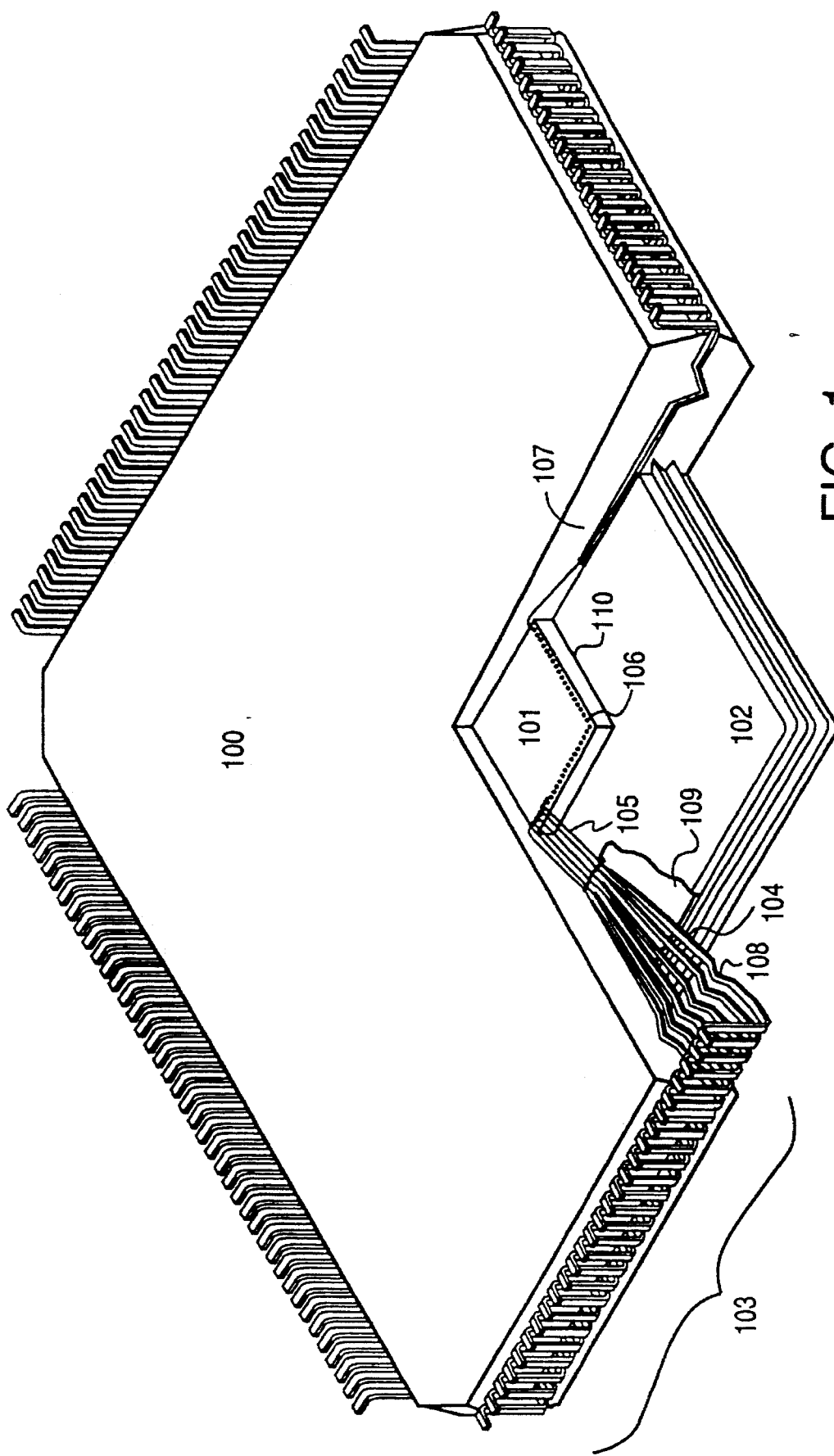
FIG. 1 is a cutaway perspective view of an ed circuit package according to the invention.

FIG. 1 shows a cutaway view of an integrated circuit package 100 according to the invention. A semiconductor die 101 is mounted on a heat sink 102 by a suitable thermally conductive adhesive 110. A leadframe 103 includes multiple leads 104 arranged in a generally radial manner around the circumference of the heat sink 102. (Note that though FIG. 1 shows a package with leads on all four sides, the invention is intended to encompass packages with leads on fewer than four sides as well.) The leadframe 103 is attached to the heat sink 102 by an electrically insulative material 109. The leads 104 have a stress relief section 108 located as shown in FIG. 1. Bond wires 105 connect the inner ends of each of the leads 104 to selected die contact pads 106. Encapsulant 107 surrounds the heat sink 102, die 101, bond wires 105, and interior portions of the leads 104. Though not visible in FIG. 1, the side of the heat sink 102 to which the die 101 is not attached is exposed to the exterior of the encapsulant 107.

The integrated circuit package 100 shown in FIG. 1 is formed generally in the manner now to be described. The leadframe 103 is attached to the outer periphery of the heat sink 102 with the adhesive material 109. The semiconductor die 101, typically containing integrated circuitry, is attached to the heat sink 102 with the thermally conductive adhesive 110. One end of a bond wire 105 is attached to a selected die contact pad 106. The other end of the bond wire 105 is attached to the inner end of one of the leads 104. This process is repeated for each of the bond wires 105.

Figure 2:
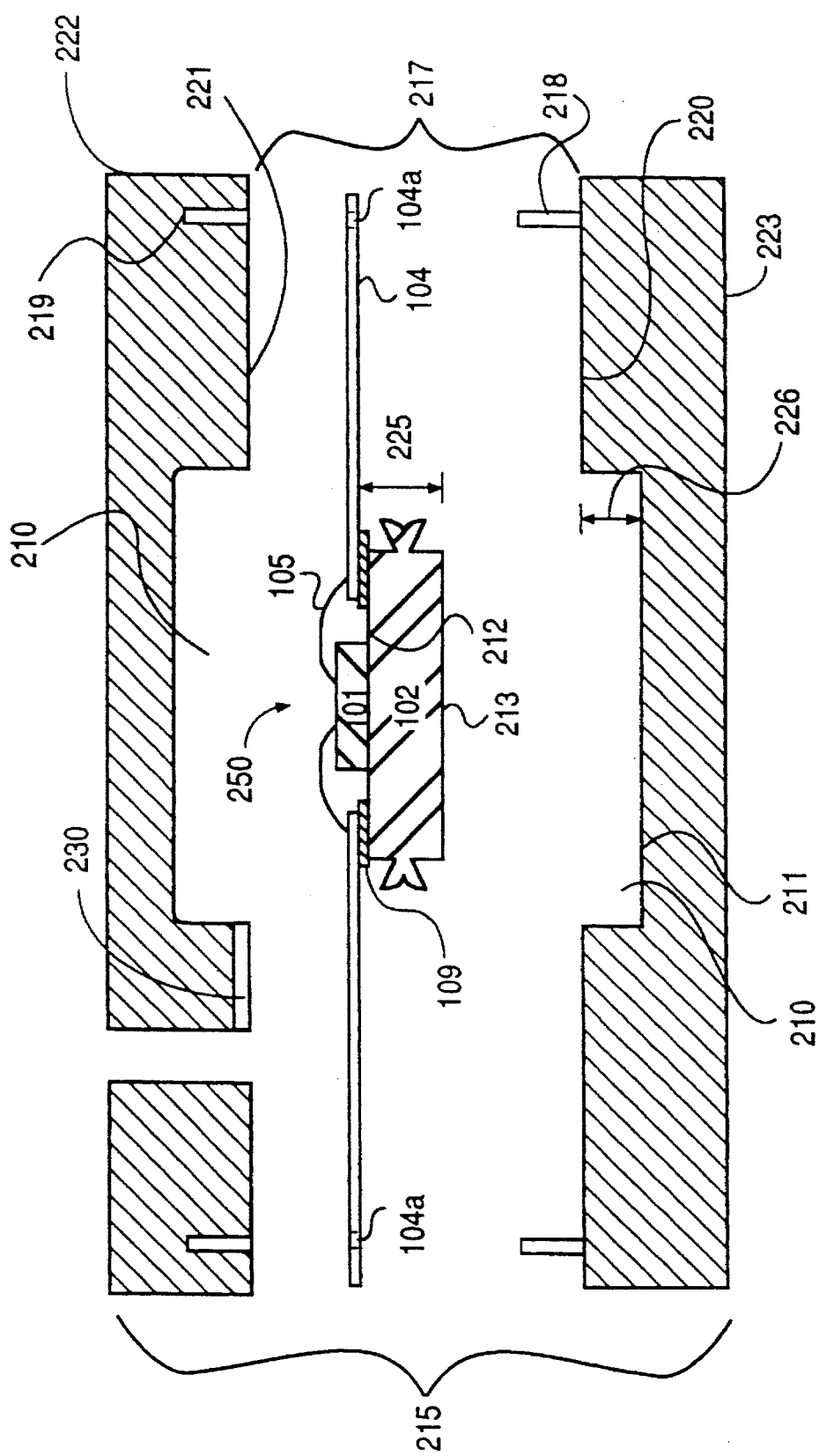
FIG. 2 is a cross-sectional view of an integrated circuit assembly disposed in a mold cavity according to one embodiment of the invention.

FIG. 2 shows a cross-sectional view of an integrated circuit 250 placed in a cavity 210 of a mold assembly 215. All elements described with respect to FIG. 1 retain the same numerical designation in FIG. 2. (Leads 104 are shown on only two sides of the heat sink 102 to increase the clarity of FIG. 2. In fact, leads may be attached on all four sides of the heat sink 102. For further clarity of FIG. 2, die contact pads 106 are also not shown.) The semiconductor die 101 is attached to a surface 212 of the heat sink 102. An opposite surface 213 of the heat sink 102 faces a surface 211 of the lower half 223 of the mold 215. The leads 104 extend outside of the mold cavity 210. Select areas of the leadframe 103 (FIG. 1) are held in place by pins 218. Clamping of the leadframe 103 occurs in region 217 when the mold 215 is closed.

The dimension 225 (the combined thickness of heat sink 102 and electrically insulative material 109) is intentionally made slightly greater than the dimension 226 of the lower half 223 of the mold 215. When the integrated circuit assembly 250 is placed in the mold cavity 210, the surface 213 of the heat sink 102 contacts the surface 211 of the lower half 223 of the mold 215. Thus, the leads 104 are raised slightly above the surface 220, prior to mold closure. The difference in the dimensions 225 and 226, and the raising of the leads 104 above the surface 220 have been exaggerated in FIG. 2 for illustrative purposes.

After the integrated circuit assembly 250 is placed in the mold cavity 210, the two halves 222, 223 of the mold 215 are brought together. As the two halves 222, 223 are brought together, but prior to complete closure of the mold 215, the upper half 222 of the mold 215 contacts the leads 104 at surface 221. The leads 104 are forced down against the surface 220 of the lower mold half 223 as the mold 215 finishes closing, but are also held laterally in place by pins 218 inserted through corresponding holes 104a in the leadframe 103. As a result, leads 104 are defected slightly and tensile forces are induced in the leads 104 when the mold 215 is closed. The tensile forces in the leads 104 act to press the heat sink surface 213 tightly against mold surface 211, thus assuring a good seal between heat sink surface 213 and mold surface 211.

After the mold 215 is fully closed, encapsulant 107 is pressure fed (for instance, by transfer molding or injection molding) into the mold cavity 210 until the cavity 210 is full. One method of accomplishing the transfer of encapsulant 107, known as top side gating, is shown in FIG. 2. Other gating methods such as gang pot, top plane gating, or bottom plane gating could also be utilized. Encapsulant 107 is transferred through channel 230 in upper mold half 222 into the mold cavity 210. When the encapsulant 107 cools and solidifies, the mold 215 is opened and the completed package 100 (FIG. 1) removed. The ends of the leads 104 left extending from the completed package 100 may then be bent if, for instance, it is desired to have them form a quad-mounted package with extending contact pins as shown in FIG. 1.

As previously noted, when the mold 215 is fully closed, a tensile force is imparted to the individual leads 104. The cumulative force produced by the total of individual leads 104 within the leadframe 103 (FIG. 1) forces the outwardly facing surface 213 of the heat sink 102 against the mold surface 211. This static force is great enough to overcome the dynamic forces created by the flow of encapsulant 107 into the mold cavity 210 that tend to separate the heat sink surface 213 from the mold cavity surface 211. It will also overcome any mismatch between the heat sink surface 213 and the mold surface 211 that may result from dimensional variations between the heat sink 102 and adhesive 109 combination and the mold cavity 210 that tend to cause separation between the surface 213 of the heat sink 102 and the surface 211 of the lower half 223 of the mold 215. Thus, a good seal between heat sink surface 213 and mold surface 211 is always assured. Encapsulant flash across the surface 213 of the heat sink 102 is eliminated by this improved seal created by the spring force of the package leads 104 pushing the heat sink surface 213 against the mold surface 211.

Figure 3C:
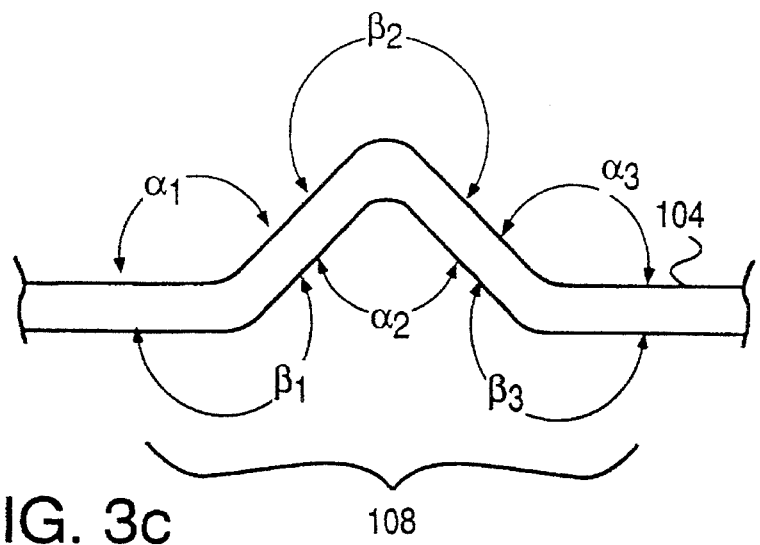
FIG. 3c is a plan view of a portion of an individual lead with a stress relief section according to another embodiment of the invention.
Figure 3B:
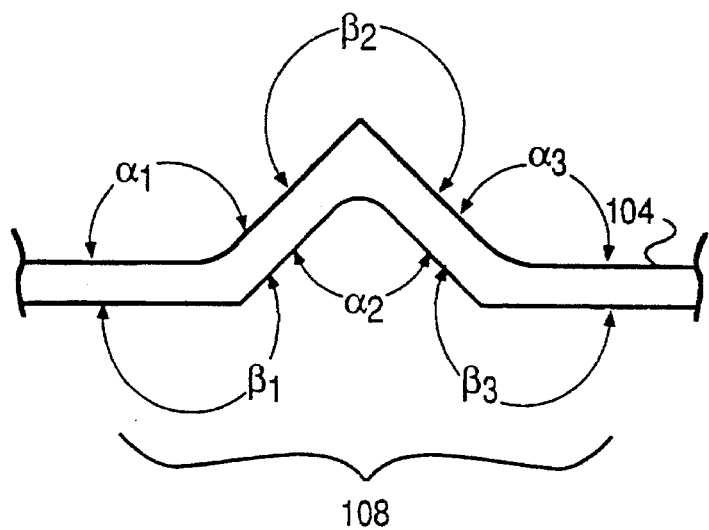
FIG. 3b is a plan view of a portion of an individual lead with a stress relief section according to another embodiment of the invention.
Figure 3A:
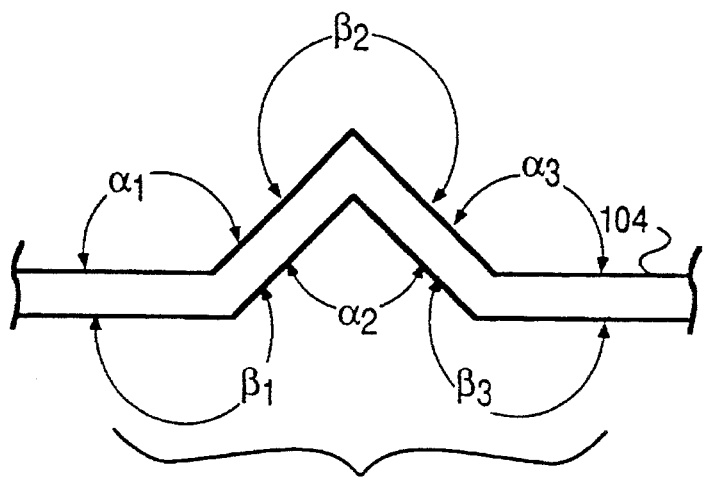
FIG. 3a is a plan view of a portion of an individual lead with a stress relief section according to one embodiment of the invention.

A plan view of one embodiment of the stress relief zig-zag section 108 of a lead 104 is shown in FIG. 3a. The zig-zag section 108 includes six angles $\alpha_1, \alpha_2, \alpha_3, \beta_1, \beta_2, \beta_3$. At each of the three bends in the lead 104, a pair of angles is formed (e.g., $\alpha_1$ and $\beta_1$), one angle on each side of the lead 104. In this description, the "inner angle" is defined to be the angle of the pair that measures less than 180° (i.e., all of the e angles); the "outer angle" is the angle that measures more than 180° (i.e., all of the $\beta$ angles). Such a zig-zag section 108 has several benefits. First, it reduces contamination of the semiconductor die 101 by increasing the length of the path that contaminants must travel to enter the die area along the interface between a lead 104 and encapsulant 107. Second, it relieves tensile and compressive stresses experienced by the lead 104. When a tensile stress is created in the leads 104, the stress relief section 108 acts as a spring which relieves this stress, preventing the lead 104 from cracking, breaking or affecting the integrity of the lead-to-heat sink attachment. In the case of compressive forces, the stress relief section 108 works in an analogous way to prevent possible buckling of the lead 104.

Production of stress in the leads 104 will, in particular, create concentrated stresses in certain parts of the stress relief section 108 shown in FIG. 3a. FIG. 3b shows a plan view of a stress relief section 108 in a lead 104 according to another embodiment of the invention. In this embodiment of the invention, additional stress relief is accomplished by rounding the vertices of the "inner angles" of each of the three bends in the lead 104. This rounding alleviates the stress concentration that builds up in the vicinity of the sharp-angled vertices of these angles in the lead 104.

FIG. 3c shows a plan view of a stress relief section 108 in a lead 104 according to another embodiment of the invention. In this embodiment of the invention, stress relief is accomplished by rounding the vertices of all of the angles, both "inner angles" and "outer angles." Again, the rounding alleviates stress concentration associated with sharp angles.

Figure 3D:
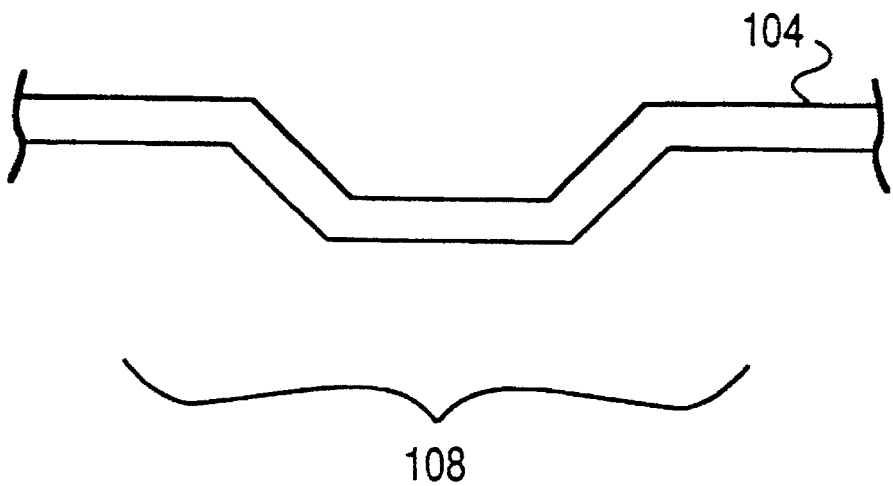
FIG. 3d is a plan view of a portion of an individual lead with a stress relief section according to another embodiment of the invention.
Figure 3E:
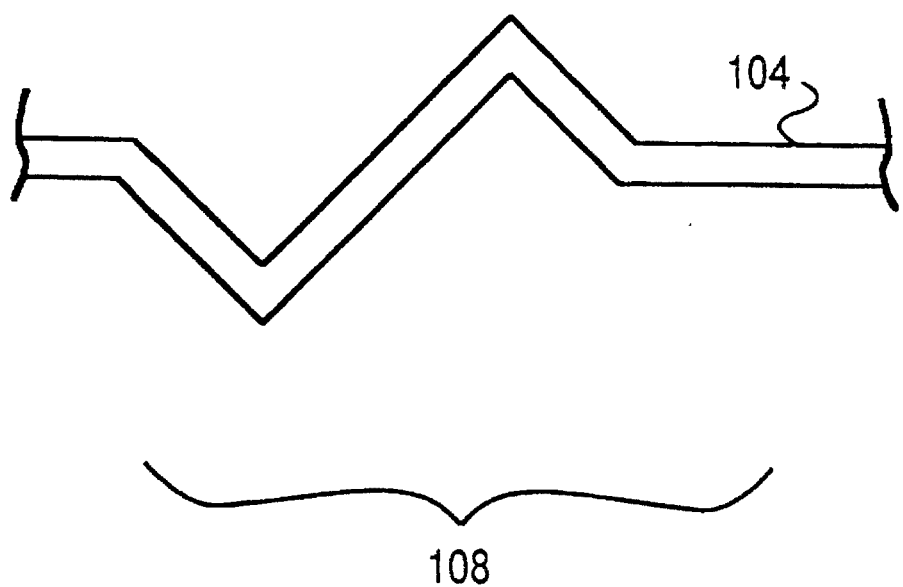
FIG. 3e is a plan view of a portion of an individual lead with a stress relief section according to another embodiment of the invention.

FIGS. 3d and 3e show additional embodiments of the stress relief section 108 according to the invention. Each of these embodiments is shown without rounding of either the "inner angles" or the "outer angles" of the bends of the leads 104. However, it should be noted that each of these embodiments could be formed with either or both of the "inner angles" or "outer angles" rounded as, for instance, shown in FIGS. 3b and 3c.

Figure 4A:
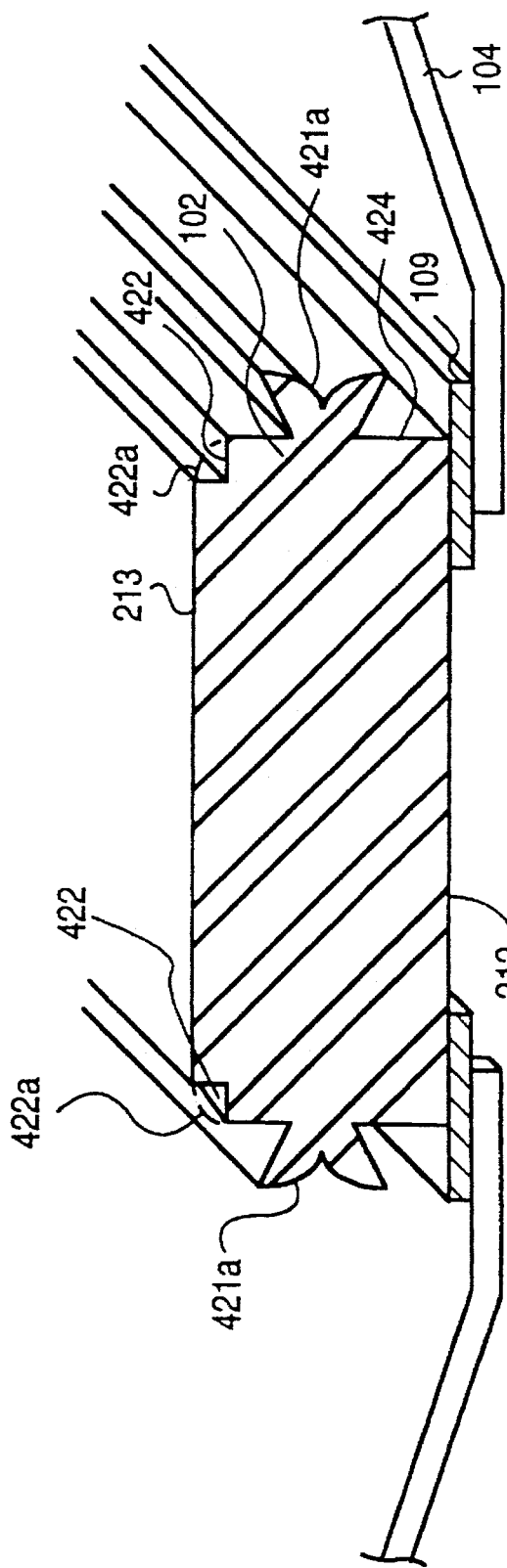
FIG. 4a is an orthogonal cross-sectional view of a heat sink with sealing ring attached to leads according to one embodiment of the invention.

FIG. 4a shows an orthogonal view of a heat sink 102 with an improved sealing ring 421a. The sealing ring 421a runs generally uninterrupted around the periphery of the heat sink 102 as shown in FIG. 4a (see also FIG. 1). Additionally, a shelf 422 is shown formed generally uninterrupted around the periphery of heat sink 102 at the interface of the surface 213 of the heat sink 102 and the surfaces 424 on which the sealing ring 421a is formed.

Figure 8A:
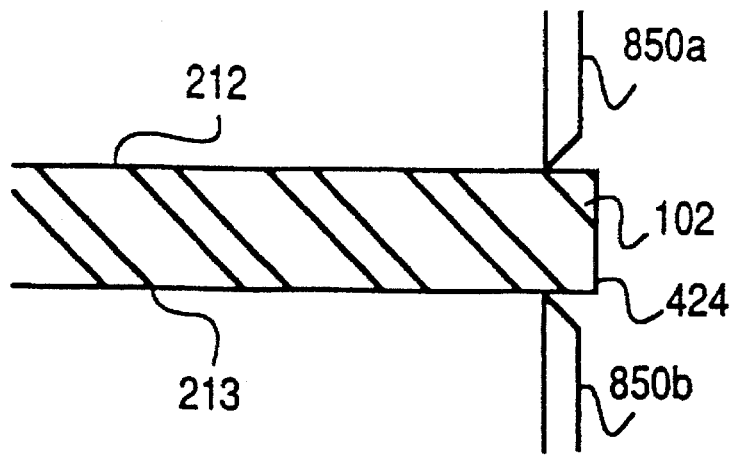
FIGS. 8a–8c show successive steps in the formation of a sealing ring on a heat sink according to one embodiment of the invention.
Figure 8B:
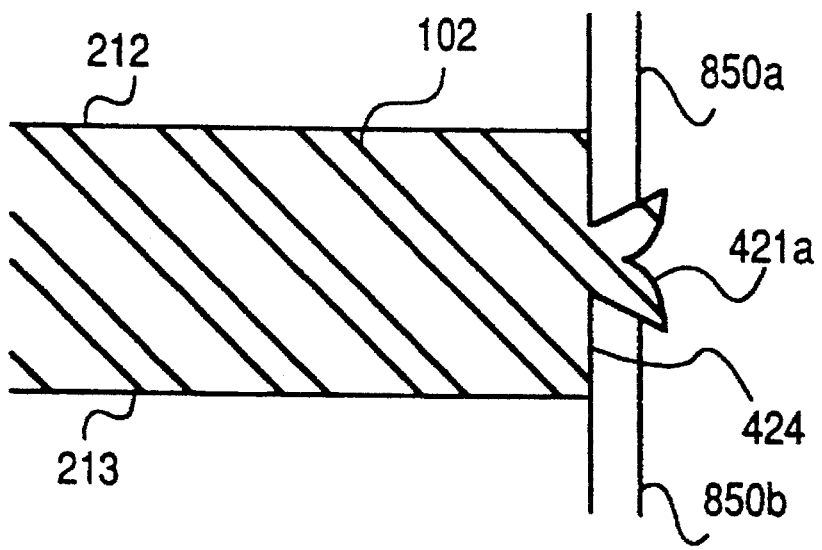
Figure 8C:
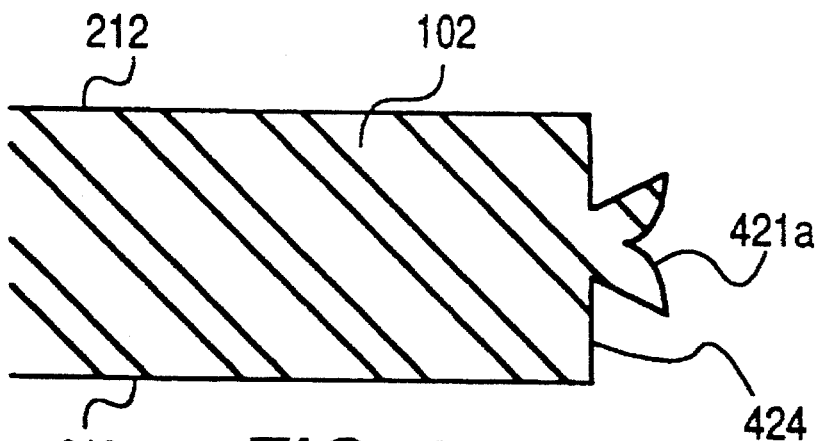

In one embodiment, the sealing ring 421a is formed by a cutting operation as shown in FIGS. 8a–8c. Cutting tools 850a, 850b cut down on the heat sink surfaces 212 and 213 at a predetermined distance from an edge of each of surfaces 212 and 213. The cutting tools 850a, 850b cut through the heat sink 102 to a predetermined depth. The cutting tools 850a, 850b do not remove material from the heat sink 102; rather, the material which is cut by the cutting tools 850a, 850b is pushed toward the center of the heat sink 102 and away from the heat sink surface 424. As can be seen in FIG. 8b, such an operation forms material around the periphery of the heat sink 102 into a "winged" or "keyed" shape. This residual material comprises the sealing ring 421a.

Figure 8D:
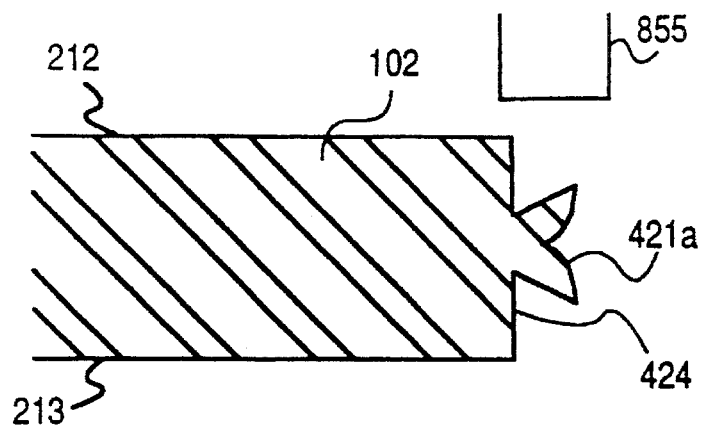
FIGS. 8d–8f show successive steps in the formation of a shelf on a heat sink according to one embodiment of the invention.
Figure 8E:
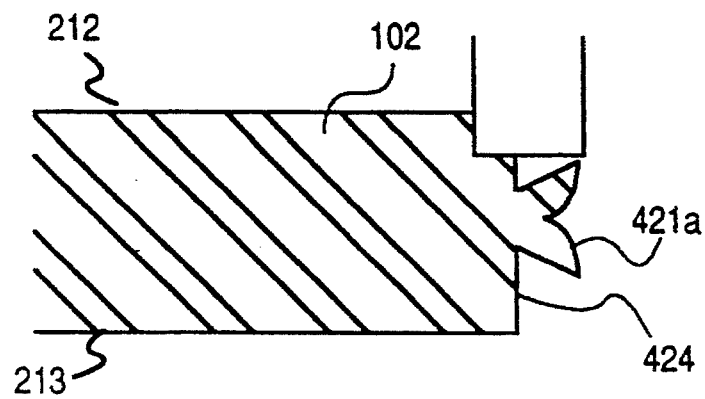
Figure 8F:
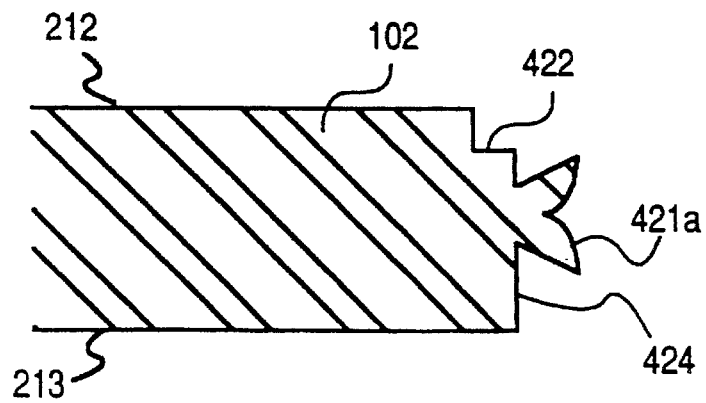

When the cutting operation takes place, it leaves, as an unwanted byproduct, a curved corner 422a as shown by the dashed line in FIG. 4a. In order to remedy the detrimental effects associated with this rounded edge (discussed in more detail below), a second operation is performed on the heat sink 102. As shown in FIGS. 8d–8f, the curved corner 422a is squared off, preferably by stamping with a stamping tool 855, to form shelf 422. Other appropriate techniques can also be used to square off the curved corner 422a, such as, but not limited to, grinding and etching.

Figure 4C:
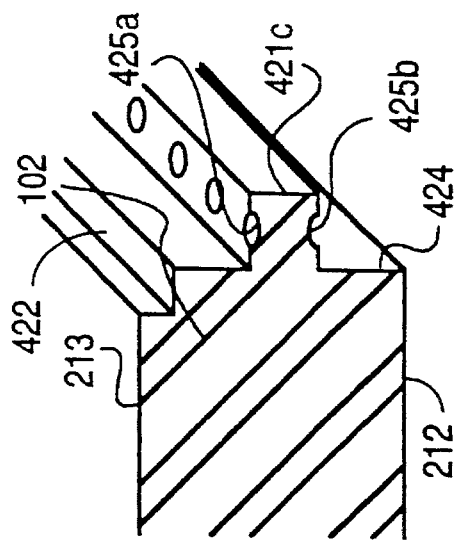
FIG. 4c is an orthogonal cross-sectional view of a portion of a heat sink with sealing ring according to yet another embodiment of the invention.
Figure 4B:
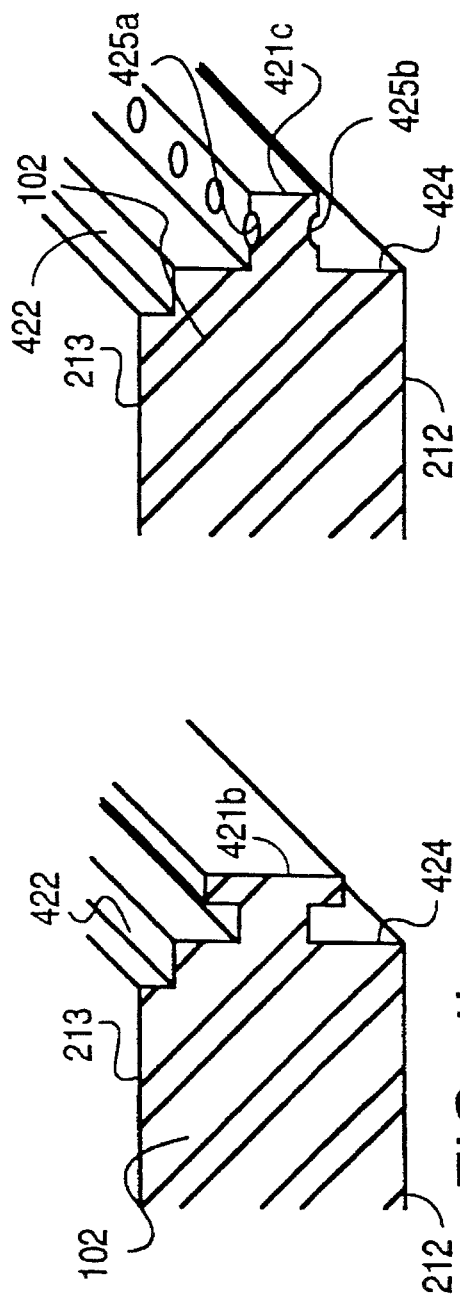
FIG. 4b is an orthogonal cross-sectional view of a heat sink with sealing ring according to another embodiment of the invention.

Other embodiments of the invention may incorporate a sealing ring 421a formed other than as described above. For instance, a sealing ring 421a according to the invention might be formed by grinding, etching, casting, punching, laser cutting or other appropriate technique. Further, the sealing ring may have other than a "winged" shape. FIGS. 4b–4d show some other possible shapes of a sealing ring according to the invention. FIG. 4b shows a sealing ring 421b with a T-shaped cross-section. FIG. 4c shows a sealing ring 421c that has a rectangular cross-section with dimples 425a, 425b formed on either side of the sealing ring 421c. Alternatively, dimples may be formed in only one side of the sealing ring 421c. FIG. 4d shows a sealing ring 421d that has a rectangular cross-section with holes 426 extending through the sealing ring 421d. In another embodiment according to the invention, shown in FIG. FIG. 4e, an indentation in heat sink 102 forms sealing ring 421e. These other embodiments are similar to the embodiment containing a "wing-shaped" sealing ring 421a in that they all provide a good compression seal between the sealing ring and the encapsulant 107 and they all reduce the migration of contaminants into the interior of the package 100. These benefits are described in more detail below.

The various configurations of the sealing ring, e.g., sealing ring 421a, provide two beneficial effects. First, these configurations result in the formation of a good compression seal between the sealing ring and the molded encapsulant 107. The formation of a compression seal is required because, otherwise, an inadequate bond is formed between the encapsulant 107 and heat sink 102. Without a good compression seal between the encapsulant 107 and heat sink 102, trapped moisture can enter the interior of the package 100 and expand or pop interior surfaces away from the encapsulant 107. A good compression seal is created during solidification of the encapsulant 107 as it shrinks around and grips the sealing ring. Without the sealing ring of the invention, the compressive forces of the encapsulant 107 form a weak seal against the heat sink 102 not capable of meeting package reliability requirements.

Second, the sealing ring, e.g., sealing ring 421a, of the invention results in a reduction of migration of contaminants to the area of the semiconductor die 101. This may occur in either of two ways. First, for some embodiments of the sealing ring according to the invention, in particular the sealing rings 421a, 421b and 421e, a longer interface is created between the heat-sink 102 and encapsulant 107 than would exist if no sealing ring were formed. This means that potential contaminants that would typically enter the die area 101 by migrating from the exterior of the package along the path between the heat sink 102 and encapsulant 107 now have a longer path to travel to reach the interior of the package 100. Second, for all of the embodiments of the sealing ring according to the invention, the improved compression seal formed between the heat sink 102 and the encapsulant 107 reduces the gap between heat sink 102 and encapsulant 107 through which contaminants may potentially enter the interior of the package 100.

The recessed shelf 422 also provides two benefits. First, the rectangular path of the shelf 422 is longer than the curved corner 422a that would exist if the sealing ring were formed without the shelf 422. As with the sealing ring, this additional length of the interface between the heat sink 102 and the encapsulant 107 works to deter outside contaminants from entering the interior of the package 100 through the interface path.

Second, the creation of the recessed shelf 422 provides a precisely defined sealing area at the heat sink interface which allows snug mating of the heat sink 102 against the mold surface 211 during the molding process, thus preventing encapsulant flash or bleed on the exposed surface 213 of the heat sink 102. Too, the curved corner 422a that would exist if the shelf 422 were not formed provides more of a possibility that solidified encapsulant 107 will flake off at the surface interface between the heat sink 102 and encapsulant 107 after the package 100 has been completed.

Another embodiment of the invention is shown in FIG. 5. The surface 424 of the heat sink 102 is roughened by etching, sandblasting, rough plating, black oxide or other method. Roughened in this way, surface 424 provides a better bond between encapsulant 107 and heat sink 102 than if the surface 424 is not roughened. Further, the roughened surface 424 provides a lengthened interface between heat sink 102 and encapsulant 107 that helps reduce the influx of contaminants to the interior of the package. Though not shown in FIG. 5, the leads 104 (FIG. 4a) may also be roughened in the same way to provide these benefits.

Figure 6A:
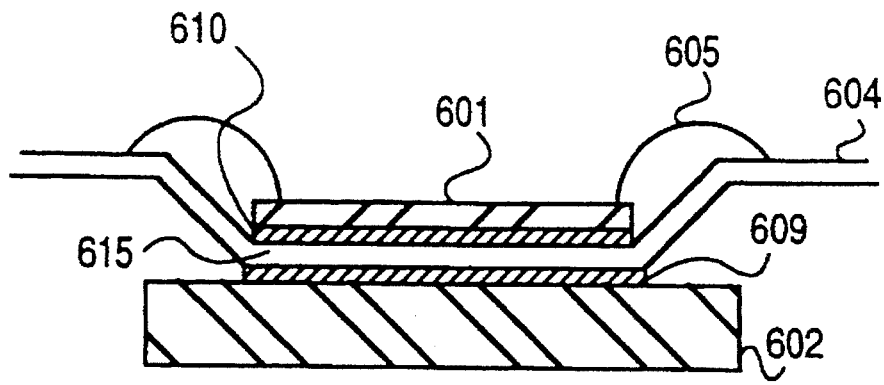
FIG. 6a is a cross-sectional view of a prior art set of connections between a semiconductor die, leadframe die mounting paddle, and heat sink.

FIG. 6a shows a cross-sectional view of a prior art set of connections between a semiconductor die 601, leadframe die mounting paddle 615, and heat sink 602. Semiconductor die 601 and heat sink 602 are mounted on opposing sides of leadframe die mounting paddle 615. Thermally conductive adhesives 609 and 610 are applied to paddle 615 surfaces contacting the heat sink 602 and die 601, respectively. Heat is transferred from the semiconductor die 601 through the first layer of adhesive 610 to the die mounting paddle 615. From the die mounting paddle 615 the heat leaves the packaged integrated circuit through the die mounting paddle support beams 604, or through the second layer of adhesive 609 and the heat sink 602. This configuration provides inadequate heat transfer because of the inability of the die mounting paddle 615 to transmit sufficient heat to either the heat sink 602 or the die mounting paddle support beams 604, and because of the lack of an exposed surface of the heat sink 602.

Figure 6B:
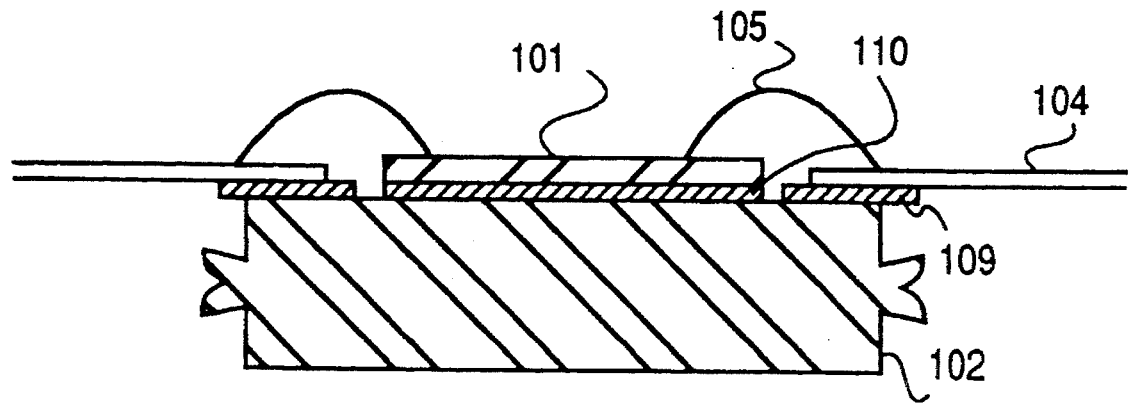
FIG. 6b is a cross-sectional view of a set of connections between a semiconductor die, leadframe and heat sink according to one embodiment of the invention.

FIG. 6b is a cross-sectional view of a set of connections between a semiconductor die 101, leads 104 and heat sink 102 according to one embodiment of the invention. A thermally conductive adhesive 110 attaches the semiconductor die 101 directly to the heat sink 102 and a dielectric adhesive material 109 attaches the leads 104 to the heat sink 102. The more direct connection between the die 101 and heat sink 102 (as compared to the prior art connection shown in FIG. 6a) allows increased heat transfer from the die 101 to the heat sink 102. The heat is then, in turn, transferred outside of the package 100 (FIG. 1) through the surface of the heat sink 102 exposed outside the package 100. The exposed surface allows greater heat transfer from the package 100 than would occur if plastic encapsulant 107 (FIG. 1) covered the heat sink surface, because the presence of such encapsulant 107 represents an additional thermal barrier. Further, greater heat transfer from the die 101 to the leads 104 occurs because of the bonding of the leads 104 to the heat sink 102.

Figure 7A:
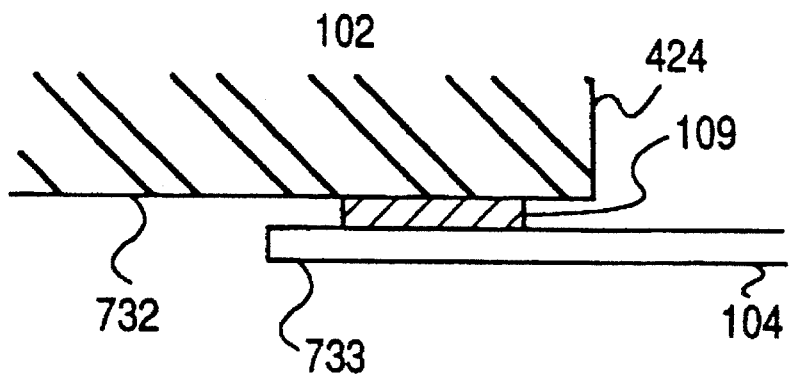
FIG. 7a is a cross-sectional view of a heat sink connected to a lead by an adhesive-coated dielectric tape.
Figure 7B:
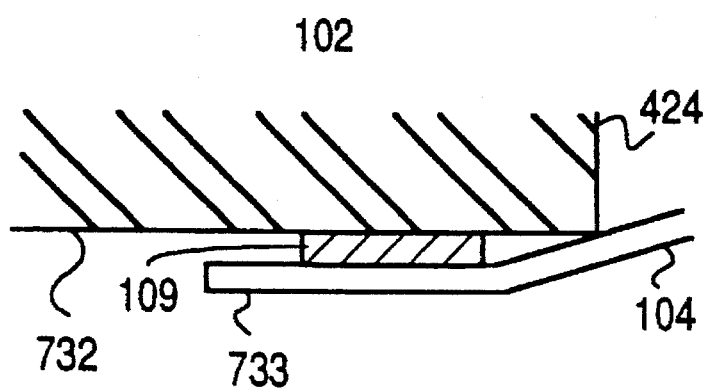
FIG. 7b is a cross-sectional view of the connection of FIG. 7a showing electrical shorting that may result between heat sink and lead.
Figure 7C:
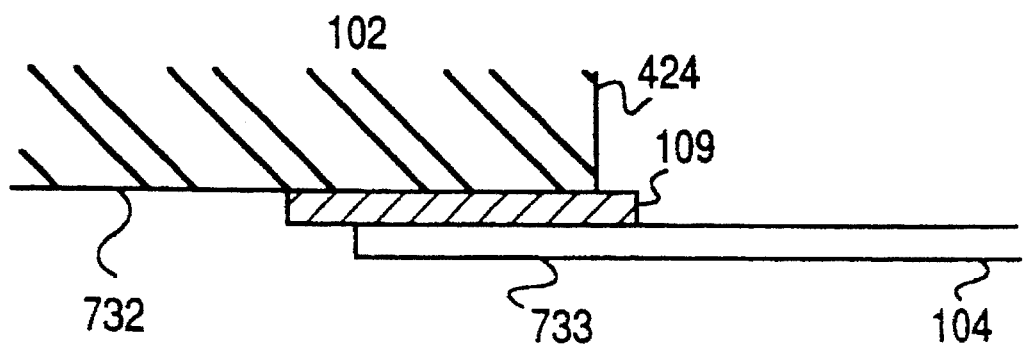
FIG. 7c is a cross-sectional view of a heat sink connected to a lead by an adhesive-coated dielectric tape according to the invention.

FIGS. 7a–7c show another aspect of the invention. FIG. 7a shows a cross-sectional view of a heat sink 102 connected to a lead 104 by an adhesive-coated dielectric tape 109. As can be seen in FIG. 7b, if forces are applied to either the heat sink 102 or the outer ends of the leads 104, undesirable electrical shorting between the leads 104 and the heat sink 102 can result. Further, the possibility of such undesired electrical contact is exacerbated by manufacturing tolerances that allow variance in positioning of particular leads 104 with respect to the heat sink 102 and adhesive 109.

FIG. 7c shows the connection of FIGS. 7a and 7b made according to one embodiment of the invention. In FIG. 7c, the dielectric adhesive 109 is affixed between the inner end 733 of the lead 104 and the periphery of the surface 732 of the heat sink 102. The adhesive 109 is extended beyond the outer periphery of the heat sink 102, as well as beyond the inner end 733 of the lead 104, for distances sufficient to ensure electrical isolation between the leads 104 and the heat sink 102 even when mold closure bends the two toward each other. The greater area of the dielectric tape 109 also reduces stress in the tape 109 that results from the transfer of forces between the heat sink 102 and leads 104, since those forces are distributed over a greater area.

Various embodiments of the invention have been described. The descriptions are intended to be illustrative, not limitative. Thus, it will be apparent to one skilled in the art that certain modifications may be made to the invention as described without departing from the scope of the claims set out below.

We claim:

1. Structure comprising:

a semiconductor die having a first surface containing a plurality of die contact pads, and a second surface opposite the first surface;

a heat sink having a planar first surface, and a planar second surface proximal to and opposite the first surface;

a die attach adhesive attaching the second surface of the die to the first surface of the heat sink;

a plurality of electrically conductive leads, each lead having an inner end and an outer end, an electrically insulative adhesive layer attaching a first portion of each of the inner ends to the first surface of the heat sink such that heat is conducted from said heat sink outwardly through said plurality of leads;

a plurality of electrically conductive bond wires, each bond wire connecting one of the die contact pads to the inner end of one of the leads;

an encapsulant encapsulating the heat sink, semiconductor die, die attach adhesive, bond wires, and an inner portion of the leads including said first portion of said lead inner ends, the second surface of the heat sink remaining exposed outside the encapsulant; and wherein the electrically insulative adhesive layer is an adhesive-coated tape.

2. Structure comprising:

a semiconductor die having a first surface containing a plurality of die contact pads, and a second surface opposite the first surface;

a heat sink having a planar first surface and a planar second surface proximal to and opposite the first surface;

a die attach adhesive attaching the second surface of the die to the first surface of the heat sink;

a plurality of electrically conductive leads, each lead having an inner end and an outer end;

a plurality of electrically conductive bond wires, each bond wire connecting one of the die contact pads to the inner end of one of the leads;

an encapsulant encapsulating the heat sink, semiconductor die, die attach adhesive, bond wires, and an inner portion of the leads; and wherein at least one lead is formed with at least two bends, wherein the at least two bends are located within the encapsulant between an outer edge of the heat sink and an outer edge of the encapsulant; and wherein each of the at least two bends in the at least one lead has an inner angle measuring less than 180° and an outer angle measuring greater than 180°, the vertex of at least one of the inner angles being rounded.

3. Structure as in claim 2, wherein the vertex of at least one of the outer angles is rounded.

4. Structure as in claim 1, wherein a sealing ring is formed on the heat sink on at least one surface perpendicular to the first surface of the heat sink.

5. Structure as in claim 4, wherein:

said sealing ring extends outwardly from said heat sink perpendicular surface in a direction perpendicular to the first and second surfaces of the heat sink; and the thickness of said sealing ring measured parallel to said perpendicular surface of the heat sink, at said perpendicular surface is less than the thickness of the sealing ring at a location displaced laterally and outwardly from said perpendicular surface.

6. Structure as in claim 4, wherein the sealing ring has a winged cross-sectional shape.

7. Structure as in claim 4, wherein the sealing ring has a T-shaped cross-section.

8. Structure as in claim 1, wherein at least one lead is formed with at least two bends, the bends being located within the encapsulant between an edge of the heat sink and an edge of the encapsulant.

9. Structure comprising:

a semiconductor die having a first surface containing a plurality of die contact pads, and a second surface opposite the first surface;

a heat sink having a planar first surface, and a planar second surface proximal to and opposite the first surface;

a die attach adhesive attaching the second surface of the die to the first surface of the heat sink;

a plurality of electrically conductive leads, each lead having an inner end and an outer end, an electrically insulative adhesive layer attaching a first portion of each of the inner ends to the first surface of the heat sink such that heat is conducted from said heat sink outwardly through said plurality of leads;

a plurality of electrically conductive bond wires, each bond wire connecting one of the die contact pads to the inner end of one of the leads;

an encapsulant encapsulating the heat sink, semiconductor die, die attach adhesive, bond wires, and an inner portion of the leads including said first portion of said lead inner ends, the second surface of the heat sink remaining exposed outside the encapsulant;

wherein a sealing ring is formed on the heat sink on at least one surface perpendicular to the first surface of the heat sink;

wherein at least one lead is formed with at least two bends, the bends being located within the encapsulant between an edge of the heat sink and an edge of the encapsulant; and wherein said bends in said leads each have an inner angle measuring less than 180° and an outer angle measuring greater than 180°, the vertex of at least one of the inner angles being rounded.

10. A heat sink with first planar and second planar surfaces, the second surface being opposite and substantially parallel to the first surface, wherein:

the heat sink is formed with a sealing ring on at least one surface that is substantially perpendicular to the first and second surfaces of the heat sink;

the sealing ring extending outwardly perpendicular to said perpendicular surface of the heat sink;

the thickness of the sealing ring in a direction parallel to said perpendicular surface of the heat sink, at the perpendicular surface is less than a thickness of the sealing ring at a location displaced laterally and outwardly from said perpendicular surface; and wherein the heat sink has at least one surface perpendicular to the first and second surfaces of the heat sink that is roughened such that the encapsulant grips the at least one perpendicular surface forming a bond therewith.

11. Structure as in claim 1, wherein a shelf is formed at an outer edge of the second surface of the heat sink, the shelf beginning at a predetermined location from the outer edge of the second surface of the heat sink and extending to a depth sufficient to form a squared off corner at said outer edge.

12. Structure as in claim 1, wherein a portion of the electrically insulative adhesive layer extends beyond a periphery of the heat sink such that shorting of said leads to said heat sink is prevented and stresses in the leads are distributed about said periphery.

13. Structure as in claim 1, wherein the heat sink has at least one surface perpendicular to the first and second surfaces of the heat sink that is roughened such that the encapsulant grips the at least one perpendicular surface forming a bond therewith.

14. A heat sink as in claim 10, wherein a shelf is formed along an outer edge of the second surface of the heat sink adjacent to said perpendicular surface, the shelf beginning at a predetermined location from the outer edge of the second surface of the heat sink and extending to a depth sufficient to form a squared off corner along said outer edge of the second surface.

15. A heat sink as in claim 10, wherein the sealing ring has a winged cross-sectional shape.

16. A heat sink as in claim 10, wherein the sealing ring has a T-shaped cross-section.

17. Structure as in claim 1, wherein a portion of the electrically insulative adhesive extends beyond the inner ends of the leads.

18. Structure as in claim 1, wherein the heat sink has at least one surface perpendicular to the first and second surfaces of the heat sink that is an etched surface such that the encapsulant grips the at least one perpendicular surface forming a bond therewith.

19. Structure as in claim 1, wherein the heat sink has at least one surface perpendicular to the first and second surfaces of the heat sink that is a black oxide-containing surface such that the encapsulant grips the at least one perpendicular surface forming a bond therewith.

20. Structure as in claim 1, wherein the heat sink has at least one surface perpendicular to the first and second surfaces of the heat sink that is a sand-blasted surface such that the encapsulant grips the at least one perpendicular surface forming a bond therewith.

21. Structure as in claim 9, wherein the vertex of at least one of the outer angles is rounded.

22. Structure as in claim 1, wherein a portion of the electrically insulative adhesive layer extends beyond the inner ends of the leads.

* * * * *